United States Patent
Andreev et al.

(10) Patent No.: US 6,704,915 B1
(45) Date of Patent: Mar. 9, 2004

(54) PROCESS FOR FAST CELL PLACEMENT IN INTEGRATED CIRCUIT DESIGN

(75) Inventors: Alexander E. Andreev, San Jose, CA (US); Ranko Scepanovic, San Jose, CA (US); Mikhail I. Grinchuk, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 344 days.

(21) Appl. No.: 09/879,643

(22) Filed: Jun. 12, 2001

Related U.S. Application Data

(63) Continuation of application No. 09/756,568, filed on Jan. 8, 2001, now abandoned.

(51) Int. Cl.[7] .............................................. G06F 17/50
(52) U.S. Cl. .............................................. 716/9; 716/2
(58) Field of Search ........................ 716/1, 2, 3, 7, 716/8, 9, 10, 11

(56) References Cited

U.S. PATENT DOCUMENTS

| | | | | |
|---|---|---|---|---|
| 5,495,419 A | * | 2/1996 | Rostoker et al. | 700/121 |
| 5,625,568 A | * | 4/1997 | Edwards et al. | 716/2 |
| 6,058,254 A | * | 5/2000 | Scepanovic et al. | 716/2 |
| 6,074,430 A | * | 6/2000 | Tsukiboshi | 716/9 |
| 6,370,673 B1 | * | 4/2002 | Hill | 716/2 |

* cited by examiner

Primary Examiner—Leigh M. Garbowski
(74) Attorney, Agent, or Firm—Westman, Champlin, Kelly

(57) ABSTRACT

A process for re-designing IC chips by altering the positions of cells from a first to a second IC chip layout. An x,y grid is established for the first and second IC layouts such that each cell has identifying x,y coordinates in the first layout. Columns are established in the second layout based on the bounds of the second layout in the x-direction. The cells are sorted to the columns in the order of cell x-coordinates to establish new x-coordinates for each cell based on the x-coordinates of the respective column. The cells are sorted in each column to establish y-coordinates for each cell based on the height of the cells in the column and the height of the column.

20 Claims, 2 Drawing Sheets

PROCESS FOR FAST CELL PLACEMENT IN INTEGRATED CIRCUIT DESIGN

CROSS-REFERENCE TO RELATED APPLICATION

This application is a continuation of application Ser. No. 09/756,568 filed Jan. 8, 2001 now abandoned.

BACKGROUND OF THE INVENTION

This invention relates to cell placement, and particularly to the placement of cells within approximated coordinates during a redesign or modification of an integrated circuit (IC).

It is common in IC design to base new designs on ICs already developed for a prior use. One problem in redesigning ICs is that some cells of the prior design must be placed in close proximity in the new design. This is particularly important where two cells cooperate to perform certain tasks. If one cell is moved quite far from the other, wire lengths may affect metal layer routing, parasitic capacitance and signal timing.

Present automated processes for redesigning integrated circuits often move cells quite far from the original location, resulting in adverse effects resulting from increased wire length. Moreover, automated processes are not capable of performing re-design where the number of rows or columns of cells in a given direction is altered from one design to another. For example, a re-design that adds to the number of y-oriented columns of elements increases the number or length in the x-direction. Thus, expansion or contraction of a design along rows (x-direction) requires a corresponding addition or subtraction to the number of columns (y-direction) of cells. Automated processes are not helpful to perform changes in columns. Accordingly, there is a need for an automated process, operating under the control of a computer, that performs transformation of existing IC designs to new designs by approximated coordinates of the cells to correct the placement of the cells in correspondence with existing design rules.

SUMMARY OF THE INVENTION

In accordance with the present invention, the distribution of cells in a first integrated circuit chip layout is altered to position the cells in a second integrated circuit chip layout. An x,y grid is established for the first and second integrated chip layouts such that each cell has identifying x,y coordinates in the first layout and a height in the y-direction. A number of columns is established in the second layout based on the bounds of the second layout in the x-direction. The cells are sorted to the columns in the order of cell x-coordinates to establish new x-coordinates for each cell based on the x-coordinates of the respective column. Each column has a height in the y-direction. The cells are then sorted in each column to establish y-coordinates for each cell based on the height of the cells in the column and the height of the column.

In some embodiments of the process, the cells are sorted to the columns by calculating a minimum column height $H_{min}$, for all columns. A recursive algorithm is applied to distribute the cells of each column to x-positions between adjacent columns.

According to another aspect of the process, the recursive algorithm identifies a plurality of positions between adjacent columns, and identifies maximum and minimum non-overlapping ranges of x-coordinates for each position.

According to another aspect of the invention, the cells are sorted in each column to establish y-coordinates by computing a distance real_D[i] between identifying y-coordinates of adjacent cells of each column based on the first layout. A distance min_D[i] is computed in the y-direction between the adjacent cells based on the heights of the adjacent cells. An overlap over_D[i] is computed based on a difference between real_D[i] and min_D[i].

According to another aspect of the invention, a correction factor corr_D[i] is added to the y-coordinate of each cell.

According to another aspect of the invention, a computer useable medium contains a computer readable program comprising code that causes the computer to alter the distribution of cells from the first layout to the second layout.

DETAILED DESCRIPTION OF THE PREFERRED EMBODIMENTS

The present invention is directed to a process of transformation of the placement of cells in an integrated circuit (IC) chip where the design shape or number of columns are changing. The process may be carried out by a computer under the control of a computer readable program comprising code on a computer readable medium. The invention makes it possible to re-use IC designs for new purposes simply by optimizing the floorplan or layout of the existing IC chip and transform it to a new design without the need to perform cell placement. Using the techniques of the present invention, new placement layouts are designed that are topologically similar to the original layout.

Figure 1:
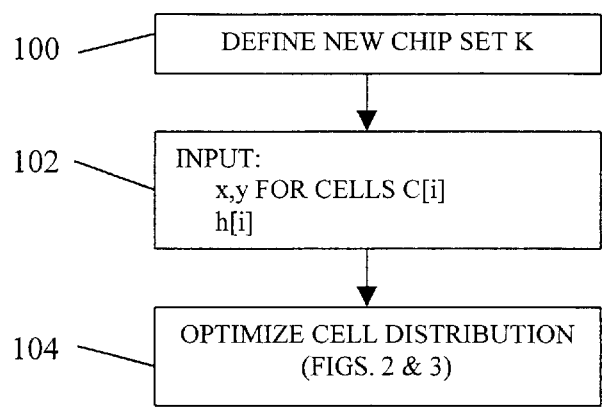
FIGS. 1–3 are flow diagrams useful in explaining the process of the present invention.

FIG. 1 is a general flow diagram illustrating the process according to the present invention. The flow diagram illustrates the process steps carried out by the computer under the control of a computer readable program code on a computer medium, such as a hard disk, floppy disk, or the like. The process employs the definition of the existing placed cells, such as by an identifying x,y coordinates for each cell. Because each cell occupies space in both the x- and y-directions, the identifying x,y coordinates might, for example, be the coordinates of the geometric center (also called the "center of gravity") of the cell. The present invention employs the same x,y grid layout for both the original (existing) IC chip design and the IC chip being designed, and changes the x,y coordinates of the cells to fit the new design. The process starts at step 100 with the definition of the shape of the new IC chip and the number of columns K of cells in that chip. At step 102, a list is input containing the x,y coordinates for each cell C[i] in the original or existing chip, and the height h[i] of each cell. The height h[i] is identified in numbers of grid elements of the x,y grid.

Figure 2:
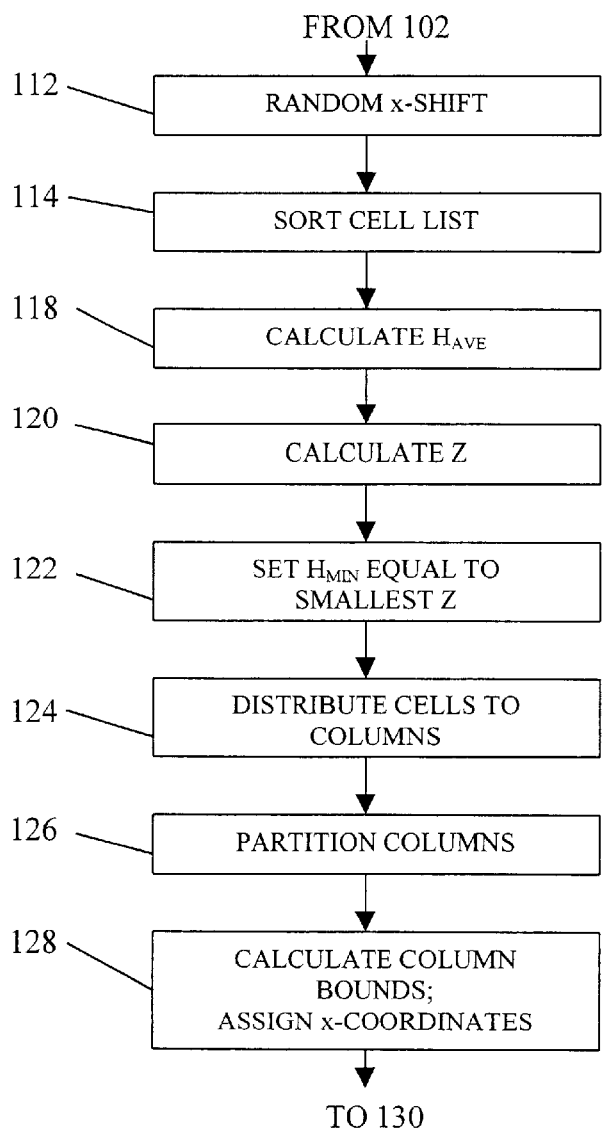
Figure 3:
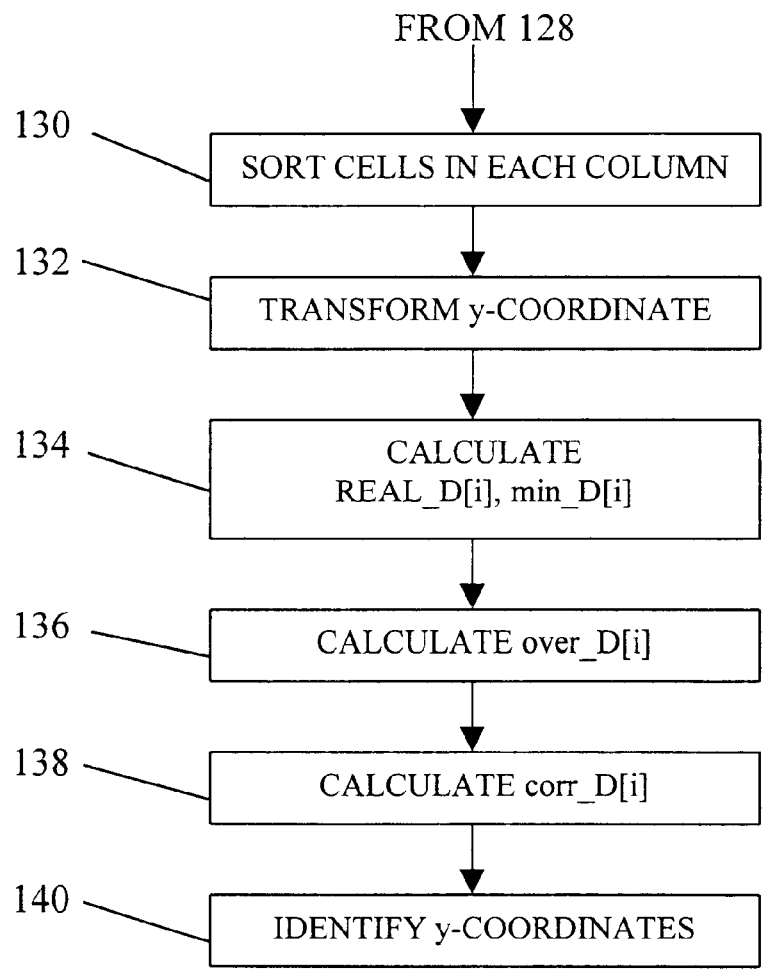

At step 104, the distribution of the cells is optimized to the new design and overlap is removed, as illustrated in greater detail at FIGS. 2 and 3. Cell distribution optimization is performed broadly by determining a minimum column height $H_{min}$ for all of the columns in the new chip, and locating column bounds.

As shown in FIG. 2, determination of the minimum column height begins at step 112 by applying a random x-shift is applied to the x-coordinates of each cell of the existing design. The x-shift is preferably smaller than the width, in the x-direction, of a column that extends in the y-direction. In preferred embodiments, the x-shift is randomly distributed between 0.0 and 1.0 microns, where one micron is much smaller than a column width. The list is then sorted at step 114 in increment order of x-coordinates, thereby forming a list of cells of $$C[0], C[1], \ldots, C[N-1],$$

where N is the number of cells. At steps 118 to 128 the list is segmented into K segments of approximately equal height in the y-direction to derive a list of indices I, where $$0 = I[0] < I[1] < \ldots < I[K-1] < I[K] = N,$$

and each k-th segment contains cells $C[I[i]], C[I[i]+1], \ldots, C[I[i+1]-2], C[I[i+1]-1]$.

Each k-th segment forms a column k having a minimum height H[k] calculated as $$H[k] = h[I[i]] + h[I[i]+1] + \ldots + h[I[i+1]-1],$$

where h[i] is the height of cell C[i] in numbers of y grid elements. The maximum value $H_{max}$ of H[k] for all columns (i.e., $H_{max}$ is maximum H[k], taken over all columns of k=0...K-1) gives the maximum possible height for correct placement of cells. The goal is to minimize this possible height, that is, to find the minimum $H_{max}$, where the minimum is taken over all possible segmentations of the list of cells.

The value of $H_{max}$ is minimized by first defining the average column height $H_{ave}$ at step 118. The average column height is derived from the sum of the heights of all cells in the IC chip, $H = h[0] + \ldots + h[N-1]$, and the number of columns K, $H_{ave} = H/K$. From this, the minimum possible height of the columns, $H_{min}$ is equal to or greater than the average column height $H_{ave}$, and is smaller than the average column height $H_{ave}$ plus the height, $h_{max}$, of the one cell C[i] having the maximum height:

$$H_{ave} \leq H_{min} < (H_{ave} + h_{max})$$

Selection of $H_{min}$ is accomplished at step 120 by determining whether the list of cells can be split into K segments of a height not greater than Z, where Z is an integer number of grid elements such that $H_{ave} \leq Z < (H_{ave} + h_{max})$. More particularly, for a given value of Z, the values are assigned for each index in the list that was derived at step 114, as follows:

I[0]=0;

I[1]=maximum number such that $I[0] \leq I[1] \leq N$ and $h[I[0]] + h[I[0]+1] + \ldots + h[I[1]-1] \leq Z$;

I[2]=maximum number such that $I[1] \leq I[2] \leq N$ and $h[I[1]] + h[I[1]+1] + \ldots + h[I[2]-1] \leq Z$;

I[K-1]=maximum number such that $I[K-2] \leq I[K-1] \leq N$ and $h[I[K-2]] + \ldots + h[I[K-1]-1] \leq Z$;

I[K]=maximum number such that $I[K-1] \leq I[K] \leq N$ and $h[I[K-1]] + \ldots + h[I[K]-1] \leq Z$.

If I[K] is smaller that N-1, then Z is too small and the process is repeated with larger values for Z until the above relationships are satisfied. The starting value of Z for this procedure is $H_{ave}$, rounded up to the nearest multiple of the grid unit. At step 122, the resulting smallest value of Z is the value for the minimum column height $H_{min}$.

The boundaries of the columns are identified by distributing the cells among columns and defining the column boundaries. The input to this procedure is the number K of segments derived in step 114, the number N of cells, the minimum column height $H_{min}$, and the height of each cell $h[0], \ldots, h[N-1]$. The goal is to distribute cells $C[0], \ldots, C[N-1]$ into K columns 0, ..., K-1. This is performed at step 124 by a recursive procedure which distributes cells $C[i], \ldots, C[j]$ in columns k, ..., l. Initially a recursive algorithm DISTRIBUTE(i, j, k, l) is performed to calculate $I[k], \ldots, I[l+1]$. The distribution of the entire set of N cells to K columns can then be performed by execution of a similar recursive algorithm DISTRIBUTE(0, N-1, 0, K-1).

If i=j or if k=l, no recursion is necessary. If i=j, there is only one cell, so the cell is placed midway between the k-th and l-th columns. Hence, the cell is placed at index kl, which is about midway between indices k and l. More particularly, index kl=floor(k+l+1)/2, and is the greatest integer rounded down from (k+l+1)/2. If k=l, there is only one column, so all cells are assigned to the column. Thus, I[k]=i, and I[k+1]=j+1, so k+1=l.

In the usual case, there will be more than one cell and more than one column. Consequently, j>i and l>k. The object is to place cells having indices between i and j into locations having indices between the k and l columns. Broadly, cells i, i+1, ..., j are divided among indices of k, k+1, ..., l. This is accomplished at step 126 by dividing the list of cells into two parts and distributing the cells in the first part into index positions k, k+1, ..., kl-1, and distributing the cell in the second part into index positions kl, kl+1, ..., l, where kl is the index described above that is about midway between columns k and l and ij is an index of an average possible cut-point in partitioning the list of cells. Distribution is performed using the same DISTRIBUTE algorithm described above.

The partitioning is performed by calculating values of IA[k], IA[k+1], ..., IA[l], IA[l+1] and IB[k], IB[k+1], ..., IB[l], IB[l+1], where the values of IA are the maximum possible boundaries and the values of IB are the minimum possible boundaries. The maximum and minimum boundaries for the cut-point are calculated at step 128 using the following algorithm. The maximum boundaries are calculated by:

IA[k]=i;

IA[k+1]=maximum integer such that $IA[k] \leq IA[k+1] \leq j+1$, and $h[IA[k]] + \ldots + h[IA[k+1]-1] \leq H_{min}$;

IA[k+2]=maximum integer such that $IA[k+1] \leq IA[k+1] \leq j+1$, and $h[IA[k+1]] + \ldots + h[IA[k+2]-1] \leq H_{min}$;

...

IA[l]=maximum integer such that $IA[l-1] \leq IA[l] \leq j+1$, and $h[IA[l-1]] + \ldots + h[IA[l]-1] \leq H_{min}$;

IA[l+1]=maximum integer such that $IA[l] \leq IA[l+1] \leq j+1$, and $h[IA[l]] + \ldots + h[IA[l+1]-1] \leq H_{min}$.

It will be appreciated by inspection of the above equations that the IA index is not larger than j+1, and the sum of the heights of the cells at each index position is smaller than the minimum column height $H_{min}$. Similarly, the minimum boundaries for the cut-off point are calculated by:

IB[l+1]=j+1;

IB[l]=minimum integer such that $IB[l+1] \geq IB[l] \geq i$ and $h[IB[l]] + \ldots + h[IB[l+1]-1] \leq H_{min}$;

IB[l-1]=maximum integer such that $IB[l] \geq IB[l-1] \geq i$, and $h[IB[l-1]] + \ldots + h[IB[l]-1 \leq H_{min}$;

...

IB[k+1]=maximum integer such that $IB[k+2] \geq IB[k+1] \geq i$ and $h[IB[k+1]] + \ldots h[IB[k+2]-1] \leq H_{min}$;

IB[k]=maximum integer such that $IB[k+1] \geq IB[k] \geq i$ and $h[IB[k]] + \ldots h[IB[k+1]-1] \leq H_{min}$.

The process of defining values for IA and IB is similar to the process described above in step 120. Index I[kl] in the middle between columns k and l (indices I[k] and I[l]) is identified as $$I[kl]=ij = \text{floor}\{(IA[kl]+IB[kl])/2\},$$

rounded down to an integer of a grid unit. The process of boundary location is repeated using indices of (i, ij−1, k, kl−1) and (ij, j, kl, l) instead of (i, j, k, l). This breaks the lists of indices into quarters, so the cells are divided among four ranges of columns between k and l.

Thus the process performs the following steps:

1) calculate kl (the average integer between k and l);
2) calculate maximum and minimum possible boundaries of columns (IA and IB);
3) calculate ij as an average integer between IA[kl] and IB[kl]; and
4) recursively distribute the first and second halves of the cells and columns lists using the cut-points ij and kl, respectively.

As a result of the distribution of cells at indices associated with the columns, each cell (or more accurately, the center of gravity of each cell is assigned an x-coordinate. Next, new y coordinates are assigned.

If a column is empty, no y-coordinates are needed. If only one cell appears in a column, the cell is placed in the middle of the column. The principal case occurs where a column contains m cells where m≧2. In this case, at step 130 the cells of each column are sorted in incremental order of y-coordinates (centers of gravity) from C[0], C[1], . . . , C[m−1]. At step 132 a linear transformation is made for the y-coordinates for all of the cells C[0], C[1], . . . , C[m−1] in the column so that the bottom of the first cell is placed at the bottom of the column and the top of the last cell is placed at the top of the column. This linear transformation makes use of the y-coordinate, Y[i], of the center of gravity of each i-th cell. In the final placement, the top and bottom cell positions will not change from that performed by the linear transformation of step 132.

In arranging the cells in each column, overlap may occur between cells. Steps 134–140 illustrate the process of eliminating overlap between cells of a column. At step 134, the distance in the y-direction between the centers of gravity of adjacent cells, Y[i+1] and Y[i], are calculated as $$\text{real}\_D[i]=Y[i+1]-Y[i],$$

and the minimum distance between the top edge of cell C[i] and the bottom edge of C[i+1] are calculated from the heights h[i] and h[i+1] of each cell $$\text{min}\_D[i]=(h[i]+h[i+1])/2.$$

At step 136 the overlap of successive cells C[i] and C[i+1] in the column is calculated as $$\text{over}\_D[i]=\text{real}\_D[i]-\text{min}\_D[i],$$

where i is not the top (m) cell, 0≦i<m. If over_D[i] is negative, cells C[i] and C[i+1] overlap, and a correction factor corr_D[i] must be calculated to add to the height of the node to remove the overlap.

At step 138, the correction factor corr_D[i] is computed using a binary tree having m−1 terminal vertices V[0], V[1], . . . , V[m−2]. The set of all terminal vertices in any subtree of the tree is some interval in the list. From the tree, over_D[V] and corr_D[V] are calculated.

More particularly, for each vertex V, a number over_D[V] id calculated as over_D[V]=over_D[i], if V is the i-th terminal node V[i], or over_D[V]=over_D[V1]+over_D[V2], otherwise. where V1 and V2 are descendants of V.

Calculation of corr_D[V] is performed from the root of the tree, initializing corr_D[V]=0. For a given node V having descendant nodes V1 and V2, calculation of corr_D[V1] and corr_D[V2] are calculated as follows:

1) if over_D[V1]≦0, then corr_D[V1]=−over_D[V1], and corr_D[V2]=corr_D[V]−corr_D[V1];
2) if over_D[V2]≦0, then corr_D[V2]=−over_D[V2], and corr_D[V1]=corr_D[V]−corr_D[V2];
3) if both over_D[V1] and over_D[V2] are greater than zero, corr_D[V1] and corr_D[V2] are the solutions to the following simultaneous equations:

$$\text{corr}\_D[V]=\text{corr}\_D(V1)+\text{corr}\_D[V2],$$

$$\frac{\text{corr}\_D[V1]}{\text{over}\_D[V1]} = \frac{\text{corr}\_D[V2]}{\text{over}\_D[V2]}.$$

The correction factor corr_D[i] is equal to the respective correction corr_D[V].

At step 140, the new y-coordinates for the center of gravity for each cell Y[i+1] are calculated based on the y-coordinate of the next lower cell Y[i], the original distance between the centers of gravity of Y[i] and Y[i+1], the distance between adjacent cells, real_D[i], and the calculated correction factor, corr_D[i]:

$$Y[i+1]=\text{round}(Y[i]+\text{real}\_D[i]+\text{corr}\_D[i]-h[i+1]/2)+h[i+1]/2$$

where round(Y[i]+real_D[i]+corr_D[i]−h[i+1]/2) is a function of Y[i]+real_D[i]+corr_D[i]−h[i+1]/2 rounded down to the nearest grid position.

The present invention may be applied to cell distribution in IC chips of irregular shape, if each column is continuous and not divided into pieces. Application to irregular shaped chips will require small modifications to the process since the minimum height of the columns is already known. Another possible generalization of the process can be achieved by replacing $H_{min}$ in the equations with a larger value of Z, where Z is some multiple of grid units.

The present invention provides an automated process, operating under the control of a computer, for redesigning integrated circuits to transform existing IC designs to new designs and establish coordinates for the cells in the new design, thereby maintaining the cells in conformance with existing design rules. The process is effective in operation and provides new coordinates for cells in the re-designed chip without resort to layout procedures.

Although the present invention has been described with reference to preferred embodiments, workers skilled in the art will recognize that changes may be made in form and detail without departing from the spirit and scope of the invention.

What is claimed is:

1. A process for altering a distribution of N cells in a first integrated circuit chip layout to position the cells in a second integrated circuit chip layout, the first and second layouts each having respective bounds, the process comprising steps of:

a) establishing an x,y grid for the first and second integrated chip layouts such that each cell has x,y coordinates in the first layout and a height in the y-direction;

b) establishing K columns based on the bounds of the second layout in the x-direction, K being an integer;

c) sorting the cells to the K columns in order of cell x-coordinates in the first layout to establish x-coordinates in the second layout for each cell based on the x-coordinates of the respective column, each column having a height in the y-direction; and d) sorting the cells in each column to establish y-coordinates in the second layout for each cell based on the height of the cells in the column and the height of the column.

2. The process of claim 1, wherein step (c) is performed by:

c1) assigning a cell index to each cell in each column, and c2) applying a recursive algorithm to distribute cells of each column to positions in the x-direction between x-coordinates of adjacent columns based on the respective cell indices.

3. The process of claim 2, wherein the recursive algorithm identifies a plurality of positions between x-coordinates of adjacent columns, and identifies maximum and minimum non-overlapping ranges of x-coordinates for each position.

4. The process of claim 2, further including:

calculating a minimum column height $H_{min}$ for all columns, wherein $H_{ave} \leq H_{min} < (H_{ave} + h_{max})$, where $H_{ave}$ is the average height of the columns and $h_{max}$ is the height of the cell of the chip having the maximum height.

5. The process of claim 4, wherein the minimum column height is calculated by:

ordering the columns in order of cell x-coordinates, defining an index for each column based on the number of cells in the column and the order position of the column, the index for the highest-ordered column being smaller than N and not smaller than N−1, defining the height of each column based on the sum of the heights of all cells in the column, and setting $H_{min}$ equal to the smallest sum of cell heights for all of the columns.

6. The process of claim 2, wherein step (c2) is performed by assigning a column index to each column, calculating an average index between column indices of respective first and second columns, calculating maximum and minimum possible boundary positions between first and second halves of the first column based on the average index, partitioning an ordered list of cell indices in the first column into first and second segments such that a cell having an index that is an average between the maximum and minimum indices of the cells defines a partition point, setting the cell whose index is the average to an index between the maximum and minimum possible boundary positions, and recursively distributing the cells of the first and second segments to the first and second halves of the column.

7. The process of claim 1, wherein step (d) includes steps of:

d1) computing a distance real_D[i] between y-coordinates of adjacent cells of each column based on the first layout, d2) computing a distance min_D[i] in the y-direction between the adjacent cells based on the heights of the adjacent cells, and d3) computing an overlap over_D[i] based on a difference between real_D[i] and min_D[i].

8. The process of claim 7, further including the step of:

d4) calculating a correction factor corr_D[i] for each cell.

9. The process of claim 8, wherein step (d4) is performed by:

defining a tree having a plurality of vertices V, calculating over_D[V] as equal to over_D[i], if V is the lowest terminal node of the tree, or equal to over_D[V1]+over_D[V2] if V is not the lowest terminal node of the tree, where V1 and V2 are descendants of V, if over_D[V1]$\leq$0, calculating corr_D[V1]=−over_D[V1], and calculating corr_D[V2]=corr_D[V]−corr_D[V1], if over_D[V2]$\leq$0, calculating corr_D[V2]=−over_D[V2], and calculating corr_D[V1]=corr_D[V]−corr_D[V2];

if both over_D[V1] and over_D[V2] are greater than zero, calculating corr_D[V1] and corr_D[V2] as solutions to:

$$\text{corr\_}D[V]=\text{corr\_}D[V1]+\text{corr\_}D[V2],$$

$$\frac{\text{corr\_}D[V1]}{\text{over\_}D[V1]} = \frac{\text{corr\_}D[V2]}{\text{over\_}D[V2]}, \text{ and}$$

setting corr_D[i] equal to the respective corr_D[V].

10. The process of claim 1, further including, before step (c):

shifting the x-coordinates of each cell in the x-direction by an amount within a selected range.

11. A computer useable medium having a computer readable program embodied therein for addressing data to alter a distribution of N cells in a first integrated circuit chip layout to position the cells in a second integrated circuit chip layout, the computer readable program comprising:

computer readable program code for causing the computer to establish an x,y grid for the first and second integrated chip layouts such that each cell has x,y coordinates in the first layout and a height in the y-direction;

computer readable code for causing the computer to establish K columns based on the bounds of the second layout in the x-direction, K being an integer;

computer readable code for causing the computer to sort the cells to the K columns in order of cell x-coordinates in the first layout to establish x-coordinates in the second layout for each cell based on the x-coordinates of the respective column, each column having a height in the y-direction; and computer readable code for causing the computer to sort the cells in each column to establish y-coordinates in the second layout for each cell based on the height of the cells in the column and the height of the column.

12. The computer readable medium of claim 11, further including:

computer readable code for causing the computer to assign a cell index to each cell in each column, and computer readable code for causing the computer to apply a recursive algorithm to distribute cells of each column to positions in the x-direction between x-coordinates of adjacent columns based on the respective cell indices.

13. The computer readable medium of claim 12, wherein the computer readable code that causes the computer to apply the recursive algorithm also causes the computer to identify a plurality of positions between x-coordinates of adjacent columns and maximum and minimum non-overlapping ranges of x-coordinates for each position.

14. The computer readable medium of claim 12, further including computer readable code for causing the computer to calculate a minimum column height, $H_{min}$, for all columns wherein $H_{ave} \leq H_{min} < (H_{ave} + h_{max})$, where $H_{ave}$ is the average height of the columns and $h_{max}$ is the height of the cell of the chip having the maximum height.

15. The computer readable medium of claim 14, wherein the computer code that causes the computer to calculate a minimum column height includes:

computer readable code for causing the computer to order the columns in order of cell x-coordinates, computer readable code for causing the computer to define an index for each column based on the number of cells in the column and the order position of the column, the index for the highest-ordered column being smaller than N and not smaller than N−1, computer readable code for causing the computer to define the height of each column based on the sum of the heights of all cells in the column, and computer readable code for causing the computer to set $H_{min}$ equal to the smallest sum of cell heights for all of the columns.

16. The computer readable medium of claim 12, wherein the computer code that causes the computer to apply a recursive algorithm to distribute cells includes:

computer readable code for causing the computer to assign a column index to each column, computer readable code for causing the computer to calculate an average index between column indices of respective first and second columns, computer readable code for causing the computer to calculate maximum and minimum possible boundary positions between first and second halves of the first column based on the average index, computer readable code for causing the computer to partition an ordered list of cell indices in the first column into first and second segments such that a cell having an index that is an average between the maximum and minimum indices of the cells defines a partition point, computer readable code for causing the computer to set the cell whose index is the average to an index between the maximum and minimum possible boundary positions, and computer readable code for causing the computer to recursively distribute the cells of the first and second segments to the first and second halves of the column.

17. The computer readable medium of claim 11, wherein the computer readable code that causes the computer to apply a recursive algorithm includes:

computer readable code for causing the computer to compute a distance real_D[i] between y-coordinates of adjacent cells of each column based on the first layout, computer readable code for causing the computer to compute a distance min_D[i] in the y-direction between the adjacent cells based on the heights of the adjacent cells, and computer readable code for causing the computer to compute an overlap over_D[i] based on a difference between real_D[i] and min_D[i].

18. The computer readable medium of claim 17, further including:

computer readable code for causing the computer to calculate a correction factor corr_D[i] for each cell.

19. The computer readable medium of claim 18, wherein the computer readable code causing the computer to add a correction factor includes:

computer readable code that define a tree having a plurality of vertices V, computer readable code for causing the computer to identify if V is the lowest vertex in the tree, computer readable code for causing the computer to calculate over_D[V] equal to over D[i], if V is the lowest terminal node of the tree, computer readable code for causing the computer to calculate over_D[V] equal to over_D[V1]+over_D[V2] if V is not the lowest terminal node of the tree, where V1 and V2 are descendants of V, computer readable code for causing the computer to calculate whether either or both over_D[V1] and over_D[V2] is greater than 0, computer readable code for causing the computer to calculate corr_D[V1]=−over_D[V1], and corr_D[V2]=corr_D[V]−corr_D[V1], if over_D[V1]≦0, computer readable code for causing the computer to calculate corr_D[V2]=−over_D[V2], and corr_D[V1]=corr_D[V]−corr_D[V2], if over_D[V2]≦0, computer readable code for causing the computer to calculating corr_D[V1] and corr_D[V2] as solutions to:

$$\text{corr\_}D[V] = \text{corr\_}D[V1] + \text{corr\_}D[V2],$$

$$\frac{\text{corr\_D}[V1]}{\text{over\_D}[V1]} = \frac{\text{corr\_D}[V2]}{\text{over\_D}[V2]}, \text{ if both over\_D}[V1] \text{ and}$$

over_D[V2] are greater than zero, and computer readable code for causing the computer to set corr_D[i] equal to the respective corr_D[V].

20. The computer readable medium of claim 11, further including:

computer readable code for causing the computer to shifting the x-coordinates of each cell in the x-direction by an amount within a selected range.

* * * * *